US011527556B2

(12) United States Patent
Li et al.

(10) Patent No.: US 11,527,556 B2
(45) Date of Patent: Dec. 13, 2022

(54) ARRAY SUBSTRATE AND DISPLAY DEVICE (71) Applicant: BOE Technology Group Co., Ltd., Beijing (CN)

(72) Inventors: Pan Li, Beijing (CN); Xinyin Wu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 842 days.

(21) Appl. No.: 16/329,796

(22) PCT Filed: Aug. 10, 2018

(86) PCT No.: PCT/CN2018/100076
§ 371 (c)(1),
(2) Date: Mar. 1, 2019

(87) PCT Pub. No.: WO2019/080596
PCT Pub. Date: May 2, 2019

(65) Prior Publication Data
US 2021/0366947 A1 Nov. 25, 2021

(30) Foreign Application Priority Data
Oct. 24, 2017 (CN) .......................... 201721381384.1

(51) Int. Cl.
*H01L 27/32* (2006.01)
*H01L 27/12* (2006.01)
*G02F 1/1362* (2006.01)

(52) U.S. Cl.
CPC .... *H01L 27/1244* (2013.01); *G02F 1/136218* (2021.01)

(58) Field of Classification Search
CPC ................. H01L 27/1244; H01L 27/12; G02F 1/136218; G02F 1/1343; G02F 1/1362;
(Continued)

(56) References Cited

U.S. PATENT DOCUMENTS

2009/0040449 A1* 2/2009 Jo ..................... G02F 1/134363
349/143
2009/0316096 A1* 12/2009 Callegari ............ G02F 1/13378
349/125
(Continued)

FOREIGN PATENT DOCUMENTS

CN 103163701 A 6/2013
CN 103901684 A 7/2014
(Continued)

OTHER PUBLICATIONS

International Search Report for PCT/CN2018/100076 dated Oct. 17, 2018.

*Primary Examiner* — Samuel Park
(74) *Attorney, Agent, or Firm* — ArentFox Schiff LLP; Michael Fainberg (57) ABSTRACT

Disclosed are an array substrate and a display device. The array substrate includes: a plurality of sub-pixel elements in an array, wherein each row of sub-pixel elements includes a common electrode; the common electrode includes a plurality of sub-common electrodes, each of which corresponds to one of the sub-pixel elements; the sub-common electrode includes a body connection section, a plurality of comb teeth connected with the body connection section, and a shielding section connected with the body connection section, wherein the first comb teeth and the shielding section are on the same side of the body connection section, and the shielding section is on the outermost side of the first comb teeth; and the body connection sections of two adjacent sub-common electrodes in the common electrode are on two opposite sides. The body connection sections of two adjacent sub-common electrodes in each common electrode are arranged on two opposite sides.

17 Claims, 6 Drawing Sheets (58) Field of Classification Search
CPC ............. G02F 1/1368; G02F 1/133707; G02F 1/134318; G02F 1/134363; G02F 1/134372; G02F 2201/124; G02F 1/134309
See application file for complete search history.

(56) References Cited

U.S. PATENT DOCUMENTS

| | | | | |
|---|---|---|---|---|
| 2010/0020283 A1* | 1/2010 | Suzuki | .............. | G02F 1/134363 349/141 |
| 2012/0104404 A1* | 5/2012 | Kwack | .............. | G02F 1/133345 257/72 |
| 2014/0146261 A1* | 5/2014 | Wu | ....................... | H01L 27/124 349/43 |
| 2017/0192571 A1* | 7/2017 | Kim | .................... | G06F 3/04166 |
| 2017/0278446 A1* | 9/2017 | Ishiyama | .......... | G02F 1/134309 |

FOREIGN PATENT DOCUMENTS

| | | |
|---|---|---|
| CN | 207396936 A | 5/2018 |
| KR | 20040039004 A | 5/2004 |

* cited by examiner

ARRAY SUBSTRATE AND DISPLAY DEVICE

This application is a National Stage of International Application No. PCT/CN2018/100076, filed on Aug. 10, 2018, which claims the priority of Chinese Patent Application No. 201721381384.1, filed with the Chinese Patent Office on Oct. 24, 2017, and entitled "An array substrate and a display device", both of which are hereby incorporated by reference in their entireties.

FIELD

The present disclosure relates to the field of display technologies, and particularly to an array substrate and a display device.

BACKGROUND

A Thin Film Transistor Liquid Crystal Display (TFT-LCD) is a common flat panel display at present, and has been widely applied to modern digital information processing devices due to its small volume, low power consumption, no radiation, high resolution, and other advantages.

SUMMARY

Some embodiments of this disclosure provide an array substrate including: a plurality of sub-pixel elements arranged in an array, wherein:

each row of the sub-pixel elements includes a common electrode;

the common electrode includes a plurality of sub-common electrodes, each of the sub-common electrodes corresponds to one of the sub-pixel elements;

the sub-common electrode includes a body connection section, a plurality of comb teeth connected with the body connection section, and a shielding section connected with the body connection section, wherein the first comb teeth and the shielding section are located on the same side of the body connection section, and the shielding section is located on the outermost side of the first comb teeth; and the body connection sections of two adjacent sub-common electrodes in the common electrode are on two opposite sides.

Optionally, two adjacent sub-common electrodes in each common electrode share a shielding section.

Optionally, each of the sub-pixel elements includes a pixel electrode;

the pixel electrode includes a protruding connection section and an electrode section; and in each of the sub-pixel elements, the protruding connection section of the pixel electrode, and the body connection section of the sub-common electrode are on two opposite sides.

Optionally, the array substrate further includes data lines and gate lines;

the data lines extend in a same direction as the shielding sections of the common electrodes, and there are overlapping areas between orthographic projections of the data lines in a direction perpendicular to the array substrate, and orthographic projections of the shielding sections of the common electrodes in the direction perpendicular to the array substrate; and the gate lines extend in a direction intersecting with the data lines.

Optionally, two adjacent sub-pixel elements connected with each gate line belong respectively to different rows.

Optionally, the gate lines are bent lines, and in the sub-pixel elements connected with a same gate line, the protruding connection sections of the respective pixel electrodes are arranged alternately in parallel.

Optionally, the pixel electrodes and the common electrodes are arranged at a same layer, and orthographic projections of the pixel electrodes in a direction perpendicular to the array substrate do not overlap with the orthographic projections of the common electrodes in the direction perpendicular to the array substrate.

Optionally, the electrode sections of the pixel electrodes include a plurality of second comb teeth connected with the protruding connection sections; and the second comb teeth and the first comb teeth are arranged alternately in parallel in a direction parallel to the extension direction of the gate lines.

Optionally, the pixel electrodes and the common electrodes are at different layers, and the electrode sections of the pixel electrodes are plate shape.

Optionally, the electrode sections of the pixel electrodes are structures including straight edges, and the first comb teeth of the common electrodes are straight.

Optionally, the electrode sections of the pixel electrodes are structures including bent edges, and the first comb teeth of the common electrodes are bent lines; and a bending angle of the bent lines of the electrode sections is same as a bending angle of the bent lines of the first comb teeth.

Optionally, the sub-common electrodes in two adjacent common electrodes are electrically connected through a connection line.

Some embodiments of this disclosure further provide a display device including the array substrate above according to embodiments of this disclosure.

DETAILED DESCRIPTION OF THE EMBODIMENTS

Figure 1:
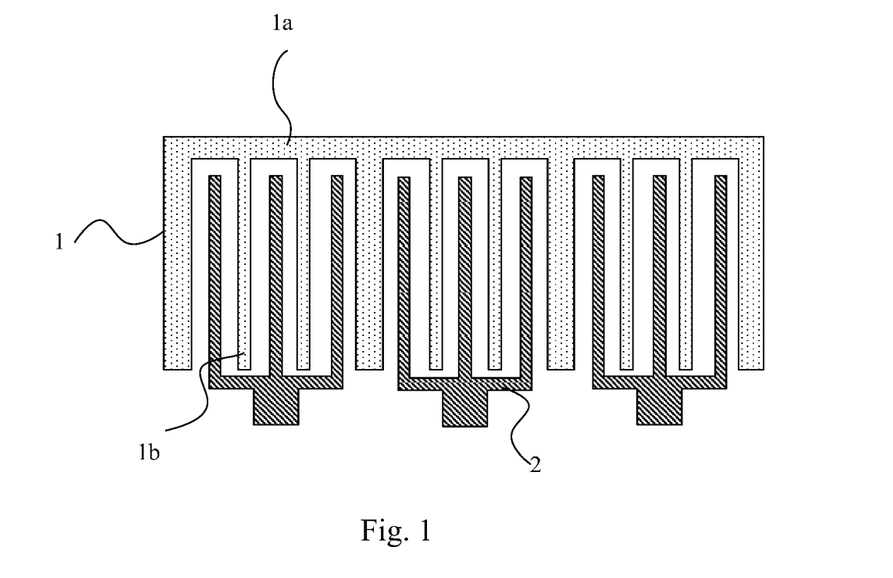
FIG. 1 is a schematic structural diagram of an arrangement pattern of the common electrodes and the pixel electrodes in the related art.

In the array substrate in the related art, FIG. illustrates an arrangement pattern of a common electrode 1 and t pixel electrodes 2, where the pattern of the common electrode 1 is like a comb, and since the widths of body connection sections 1a of the common electrode 1 are larger, there are lower resistances of the body connection sections 1a, and high resistances of teeth 1b of the comb, so that there is a non-uniform resistance of the common electrode 1 as a whole, thus degrading a display effect of a display device as a whole.

In view of this, the embodiments of this disclosure provide an array substrate and a display device so as to address the problem in the array substrate in the related art that the resistances of the common electrodes are not uniform in the arrangement pattern of the common electrodes and the pixel electrodes, thus degrading a display effect of the display device as a whole.

The technical solutions according to the embodiments of this disclosure will be described below clearly and fully with reference to the drawings in the embodiments of this disclosure, and apparently the embodiments to be described below are only a part but not all of the embodiments of this disclosure. Based upon the embodiments here of this disclosure, all the other embodiments which can occur to those ordinarily skilled in the art without any inventive effort shall fall into the scope of this disclosure.

The sizes and shapes of respective layer patterns in the drawings are not intended to reflect their real proportion, but only intended to illustrate the disclosure. Further to the existing array substrate, an arrangement pattern of common electrodes is changed in an array substrate according to some embodiments of this disclosure in such a way that body connection sections of two adjacent sub-common electrodes in each common electrode are arranged on two opposite sides, that is, two adjacent body connection sections with lower resistances in each common electrode are arranged on two sides, so that the uniformity of the resistance of the common electrode can be improved to thereby improve a display effect of a display device as a whole. A particular structure of the array substrate will be described below in details.

Figure 2:
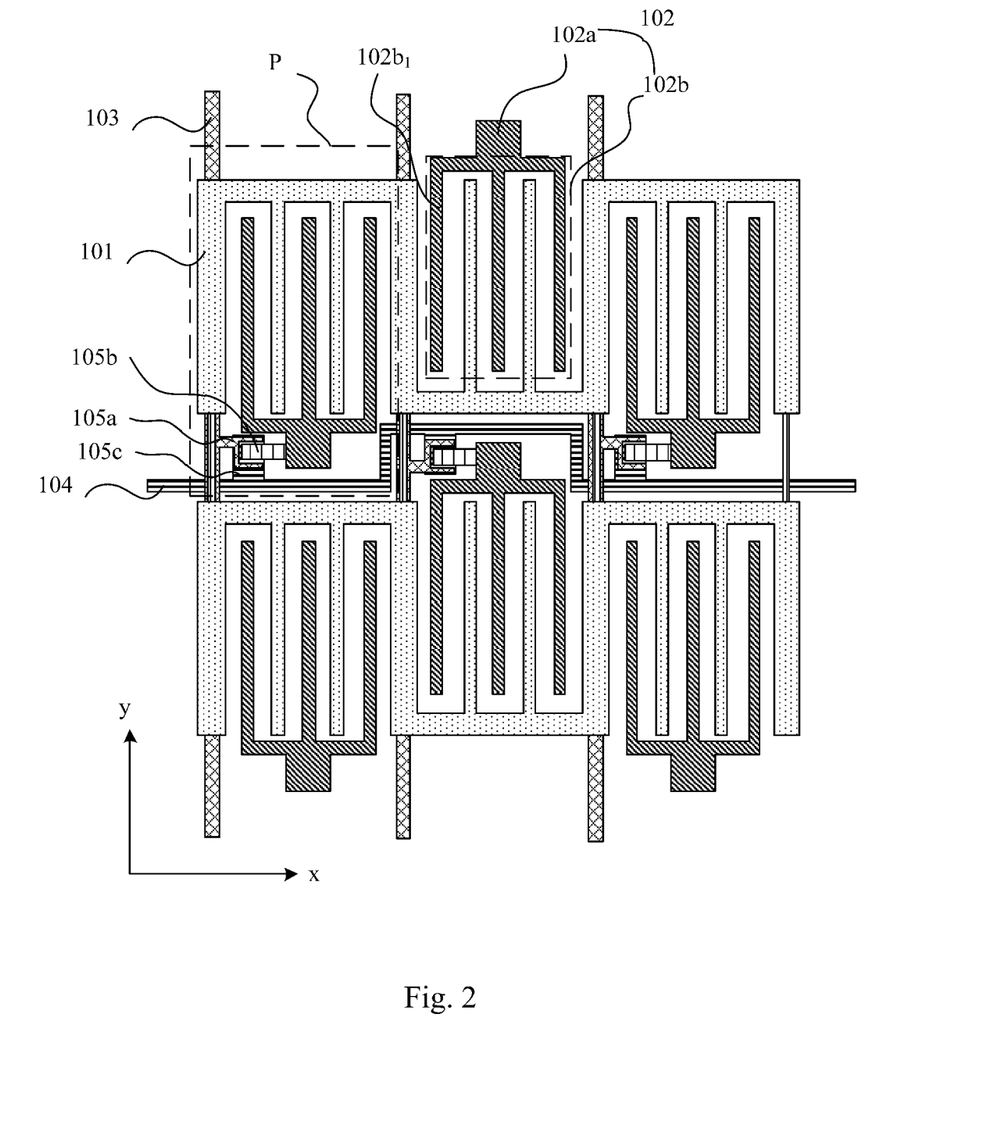
FIG. 2 is a schematic structural diagram of an array substrate according to some embodiments of this disclosure in a top view.

FIG. 2 illustrates a schematic structural diagram of an array substrate according to some embodiments of this disclosure in a top view; and for the sake of a convenient description, only 3 by 2 sub-pixel elements are illustrated in the embodiment of this disclosure, and FIG. 2 is only a schematic diagram, but a real fabrication process will not be only limited to 3 by 2 sub-pixel elements, and the sub-pixel elements can alternatively be arranged in other different patterns, although a common rectangular arrangement pattern is illustrated in the embodiment of this disclosure only by way of an example. Furthermore the array substrate according to the embodiment of this disclosure can be structured differently, and FIG. 2 illustrates only one of feasible structures of the array substrate only for the sake of a convenient description, but this disclosure will not be limited thereto. A number of array substrates in other structures will be further described in further embodiments of this disclosure hereinafter.

As illustrated in FIG. 2, an array substrate according to some embodiments of this disclosure includes: a plurality of sub-pixel elements P arranged in an array; there is a common electrode 101 for each row of sub-pixel elements P.

Figure 3:
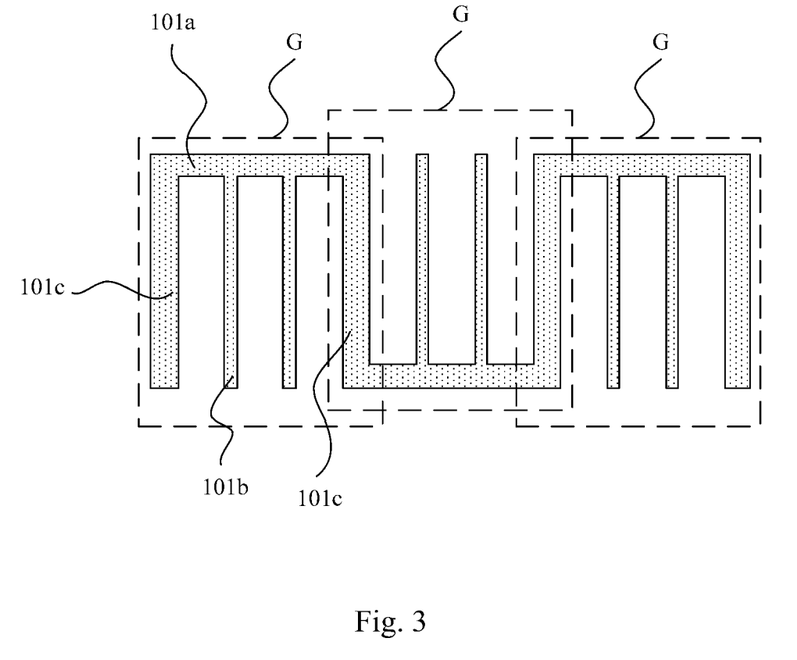
FIG. 3 is a schematic structural diagram of a common electrode according to some embodiments of this disclosure in a top view.

In order to make a particular structure of the common electrodes apparent, FIG. 3 illustrates a schematic structural diagram of a separate common electrode 101 corresponding to FIG. 2 according to some embodiments of this disclosure, that is, FIG. 3 illustrates a schematic structural diagram of a common electrode 101 according to some embodiments of this disclosure in a top view; and each common electrode 101 includes a plurality of sub-common electrodes each of which corresponds to one of the sub-pixel elements P.

The sub-common electrode G includes a body connection section 101a, a plurality of comb teeth 101b connected with the body connection section 101a, and a shielding section 101c connected with the body connection section 101a, where the first comb teeth 101b and the shielding section 101c are located on the same side of the body connection section 101a, and the shielding section 101c is located on the outermost side of the first comb teeth 101b.

The body connection sections 101a of two adjacent sub-common electrodes G in the common electrode 101 are located on two opposite sides.

Optionally, in the array substrate above according to the embodiment of this disclosure, for the sake of convenient arrangement, both the first comb teeth 101b and the shielding section 101c can be arranged perpendicular to the body connection section 101a; or of course, they can alternatively be arranged in other structures, and the body connection section 101a, the first comb teeth 101b, and the shielding section 101c may not be arranged in a regular rectangular structure, but may be arranged in other structures as needed. The drawing in the embodiment of this disclosure is only one of feasible schematic structural diagrams, but not intended to limit this disclosure thereto.

Optionally, in the array substrate above according to the embodiment of this disclosure, in order to address the problem in the related art of a non-uniformity of the common electrode, the body connection sections 101a of two adjacent sub-common electrodes G in each common electrode 101 are located on two opposite sides, that is, the body connection sections 101a of the first sub-common electrode G and the second sub-common electrode G from the left to the right are arranged on two opposite sides, and the body connection sections 101a of the second sub-common electrode G and the third sub-common electrode G from the left to the right are also arranged on two opposite sides; and the other sub-common electrodes G are arranged alternately in this way, as illustrated in FIG. 2 and FIG. 3.

Optionally, the body connection section 101a of each sub-common electrode G generally has a larger width and a lower resistance, so the body connection sections 101a of two adjacent sub-common electrodes G in each common electrode 101 are located on two opposite sides in the embodiment of this disclosure, so that adjacent body connection sections 101a with lower resistances in each common electrode 101 can be arranged on two sides in a disperse manner to thereby improve the uniformity of the resistance of the common electrode 101 so as to improve a display effect of a display device as a whole.

In order to enable the respective sub-common electrodes G to be arranged more densely to thereby save a layout space, optionally in the array substrate above according to the embodiment of this disclosure, two adjacent sub-common electrodes G in each common electrode 101 can share one shielding section 101c so that the two sub-common electrodes G are connected with each other through the shielding section 101c, as illustrated in FIG. 2 and FIG. 3. Furthermore, in order to simplify a fabrication process, there may be also the same arrangement pattern of two adjacent rows of sub-common electrodes G.

Since the body connection sections 101a of two adjacent sub-common electrodes G in each common electrode 101 are located on two opposite sides in the embodiment of this disclosure, an arrangement pattern of the pixel electrodes will also be changed accordingly. Optionally in the array substrate above according to the embodiment of this disclosure, as illustrated in FIG. 2, each sub-pixel element P includes a pixel electrode 102 including a protruding connection section 102a and an electrode section 102b, and in each sub-pixel element P, the protruding connection section 102*a* of the pixel electrode 102, and the body connection section 101*a* of the sub-common electrode G can be located on two opposite sides to thereby save a layout space, where the protruding connection section 102*a* is a channel over which a display signal is applied to the pixel electrode 102, and the electrode section 102*b* of the pixel electrode 102 cooperates with the first comb tooth 101*b* of the sub-common electrode G to form an electric field for controlling liquid crystals to be deflected. A particular shape of the electrode section 102*b* can be set as needed, and for example, the electrode section 102*b* of the pixel electrode 102 can be set in a plate structure or in a structure including branches. This will be described below with reference to the drawings, so a repeated description thereof will be omitted here.

In an optional implementation, in the array substrate above according to the embodiment of this disclosure, the array substrate may further include other layers or structures, thin film transistors, data lines, gate lines, etc., in addition to the pixel electrodes 102 and the common electrodes 101 above. All of these structures can be arranged as needed, although the embodiment of this disclosure will not be limited thereto.

Optionally, in the array substrate above according to the embodiment of this disclosure, as illustrated in FIG. 2, the array substrate can further include data lines 103 and gate lines 104, where the data lines 103 generally extend in the same direction as the shielding sections 101*c* of the common electrodes there are overlapping areas between orthographic projections of the data lines 103 in the direction perpendicular to the array substrate, and orthographic projections of the shielding sections 101*c* of the common electrodes G in the direction perpendicular to the array substrate, and the gate lines 104 generally extend in the direction intersecting with the data lines 103.

Optionally, as illustrated in FIG. 2, a thin film transistor is generally arranged in each sub-pixel element P, where the thin film transistor has a source 105*a* connected with the data line 103, a drain 105*b* connected with the protruding connection section 102*a* of the pixel electrode 102, and a gate 105*c* connected with the gate line 104.

Optionally, the data line 103 and the shielding section 101*c* are generally arranged in the column direction (i.e., in the direction of the y axis), and particularly can be arranged in the form of a straight line as illustrated in FIG. 2. Since the shielding section 101*c* is primarily configured to shield a data signal applied to the data line 103 from affecting the pixel electrode 102, the shielding section 101*c* is actually also a part of the sub-common electrode so a part of the data line 103 shall be shielded by the shielding section 101*c* of the sub-common electrode G.

Figure 4:
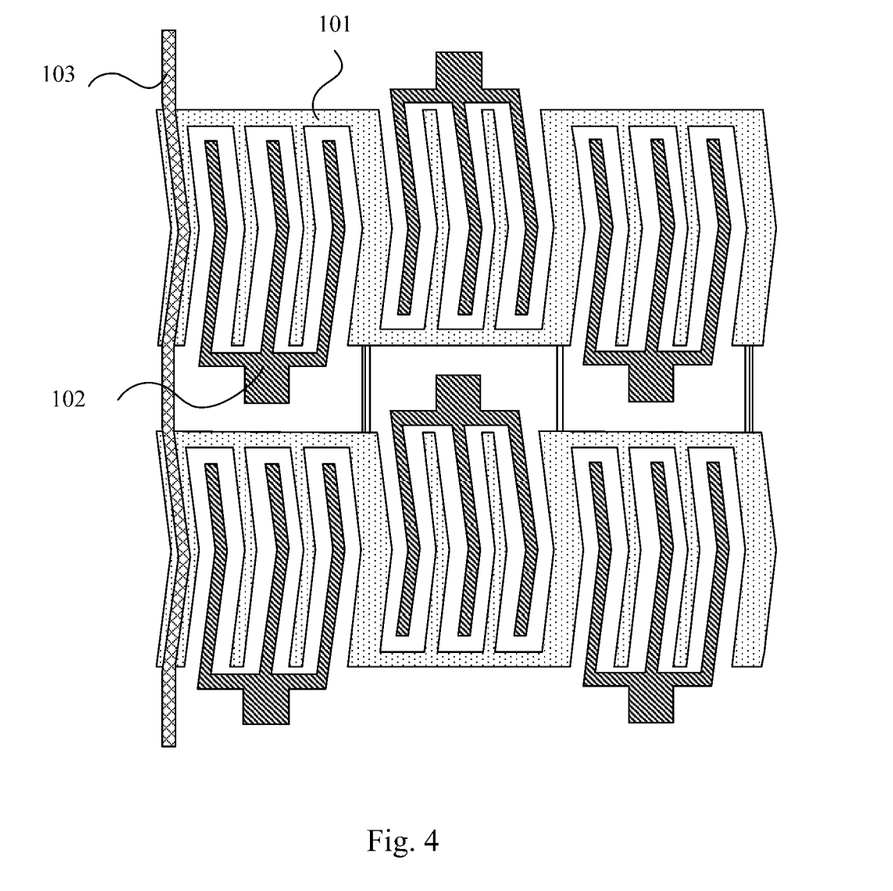
FIG. 4 is a schematic structural diagram of another array substrate according to some embodiments of this disclosure in a top view.

Alternatively the data lines 103 can be arranged as bent lines arranged in the extension direction of the shielding sections 101*c* of the sub-common electrodes and particularly as illustrated in FIG. 4, when the sub-common electrodes G are arranged as bent structures, the corresponding data lines 103 can also be arranged as bent lines bent at the same angle as the shielding sections 101*c*; and both the common electrodes 101 and the pixel electrodes 102 in FIG. 4 are also bent structures, and correspondingly the data lines 103 are also arranged as bent lines, where FIG. 4 only illustrates the data lines 103 by way of an example, but the real shape, widths, etc., of the data lines will not be limited thereto in a real fabrication process.

Optionally, the gate lines 104 are generally arranged in the row direction (i.e., in the direction of the x axis), and particularly can be arranged in the form of a straight line or a bent line, i.e., in the structure as illustrated in FIG. 2, so that the sub-pixel elements P are arranged more densely to thereby save a layout space. At this time, the protruding connection sections 102*a* of the respective pixel electrodes 102 are arranged alternately in parallel in the sub-pixel elements P connected with the same gate line 104.

Optionally, in the array substrate above according to the embodiment of this disclosure, the body connection sections 101*a* of two adjacent sub-common electrodes G in each common electrode 101 are located on two opposite sides, and the body connection section 101*a* of each sub-common electrode and the protruding connection section 102*a* of the pixel electrode 102 are located on two opposite sides, so as illustrated in FIG. 2, the protruding connection sections 102*a* of adjacent pixel electrodes 102 are actually also located on two opposite sides, so that the pixel electrodes 102 connected with the same gate line 104 generally also belong to two rows of sub-pixel elements P, and optionally, two adjacent sub-pixel elements P connected with each gate line 104 belong respectively to different rows.

Optionally, when the gate lines 104 are arranged as bent lines, the protruding connection sections 102*a* of the pixel electrodes 102 connected with the same gate line 104 can be arranged alternately in parallel so that the protruding connection sections 102*a* of the pixel electrodes 102 connected with the same gate line 104 and located in two adjacent columns of sub-pixel elements P substantially lie on the same straight line, and the protruding connection sections 102*a* of the respective pixel electrodes 102 are arranged alternately in parallel, thus enabling the sub-pixel elements P to be arranged more densely, i.e., the structure as illustrated in FIG. 2.

In an optional implementation, in the array substrate above according to the embodiment of this disclosure, there are a number of different structures and fabrication processes of the pixel electrodes 102 and the common electrodes 101, and for example, they can be fabricated together at the same layer, or can be arranged separately at different layer. Several particular structures thereof will be described below respectively.

Optionally, in the array substrate above according to the embodiment of this disclosure, the pixel electrodes 102 and the common electrodes 101 can be arranged at the same layer, and orthographic projections of the pixel electrodes 102 in the direction perpendicular to the array substrate do not overlap with the orthographic projections of the common electrodes 101 in the direction perpendicular to the array substrate.

In an optional implementation, when the pixel electrodes 102 and the common electrodes 101 are formed at the same layer, they are generally made of a transparent conductive material, metal, or another material. Since the pixel electrodes 102 and the common electrodes 101 are formed at the same layer, and each sub-pixel element P corresponds to one pixel electrode 102, and a part of the common electrode 101 (e.g., one sub-common electrode G in FIG. 2), and the sub-common electrodes G in each common electrode 101 are comblike interdigital electrodes, the pixel electrode 102 can also be comblike arranged as an interdigital electrode.

Optionally, when the pixel electrode 102 is arranged as a comblike interdigital electrode, as illustrated in FIG. 2, the electrode section 102*b* of the pixel electrode 102 generally includes a plurality of second comb teeth 102*b*1 connected with the protruding connection section 102*a*, where both the second comb teeth 102*b*1, and the first comb teeth 101*b* of the common electrode G are tooth branches, and can be arranged to be interleaved into each other, that is, the second comb teeth 102b1 of the pixel electrodes 102 can be interlaced into the first comb teeth 101b of the common electrode G.

Figure 5:
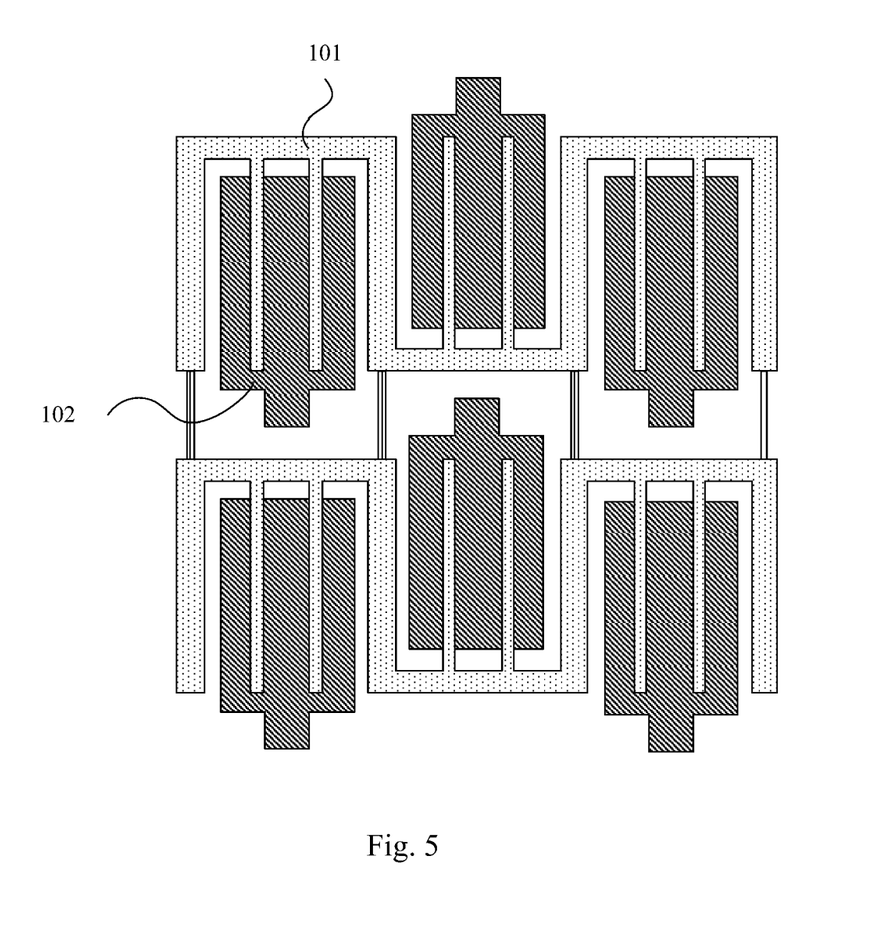
FIG. 5 is a schematic structural diagram of another array substrate according to some embodiments of this disclosure in a top view.
Figure 6:
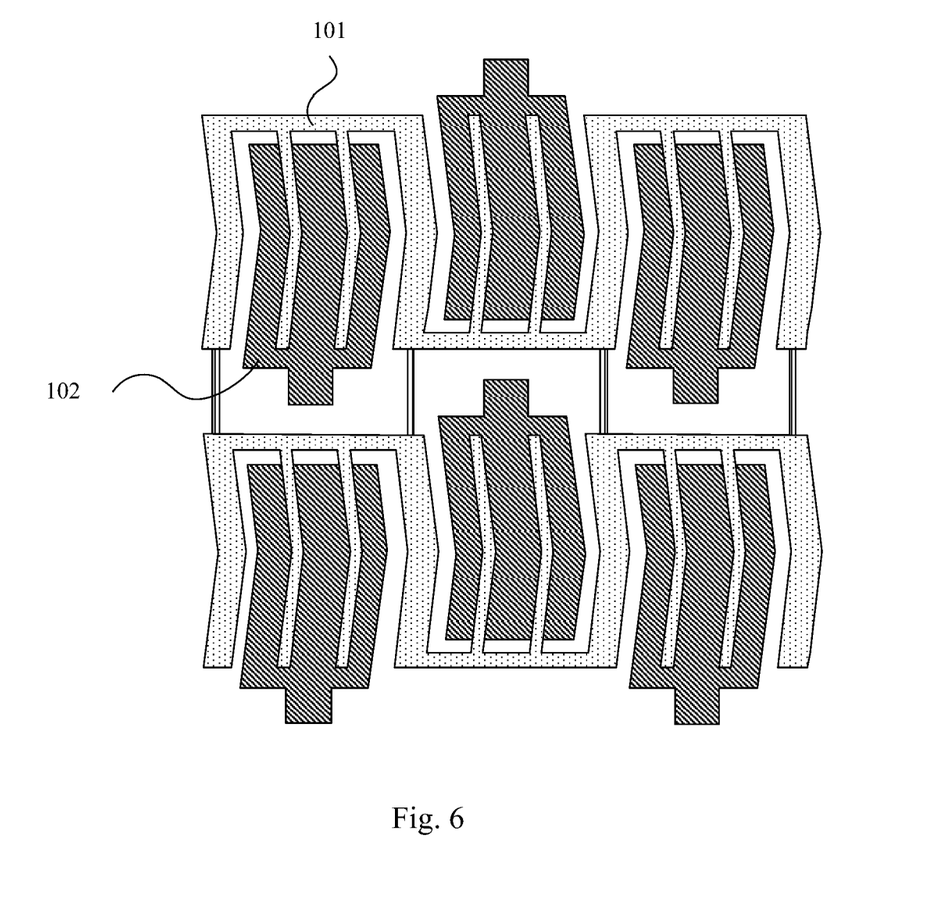
FIG. 6 is a schematic structural diagram of another array substrate according to some embodiments of this disclosure in a top view.

Optionally, in the array substrate above according to the embodiment of this disclosure, as illustrated in FIG. 5 and FIG. 6, the pixel electrodes 102 and the common electrodes 101 can alternatively be arranged at different layers, and at this time, the electrode section 102b of the pixel electrode 102 can be a plate electrode.

In an optional implementation, when the pixel electrodes 102 and the common electrodes 101 are not formed at the same layer, they are generally made of indium tin oxide (ITO), metal, or another material. At this time, since the pixel electrode 102 is fabricated separately, it can be arranged as a plate electrode.

Optionally, in the array substrate above according to the embodiment of this disclosure, pixel electrodes 102 and the common electrodes 101 can be structures including straight edges, or can be structures including bent edges, so that an image can be displayed in a multi-domain mode.

Optionally, in the array substrate above according to the embodiment of this disclosure, no matter whether the pixel electrodes 102 and the common electrodes 101 are arranged at the same layer or different layers, the pixel electrodes 102 and the common electrodes 101 can be arranged as straight structures, that is, the electrode sections 102b of the pixel electrodes 102 are structures including straight edges, and the first comb teeth 101a of the common electrodes 101 are straight; and particularly when the pixel electrodes 102 and the common electrodes 101 are arranged at the same layer, they can formed in the structure as illustrated in FIG. 2; and when the pixel electrodes 102 and the common electrodes 101 are arranged at different layers, they can formed in the structure as illustrated in FIG. 5.

Optionally, in the array substrate above according to the embodiment of this disclosure, no matter whether the pixel electrodes 102 and the common electrodes 101 are arranged at the same layer or different layers, the pixel electrodes 102 and the common electrodes 101 can alternatively be arranged as bent structures, that is, the electrode sections 102b of the pixel electrodes 102 are structures including bent edges, and the first comb teeth 101a of the common electrodes 101 are bent; and the bending angle of the folded lines of the electrode sections 102b is the same as the bending angle of the folded lines of the first comb teeth 101b, so that an image can be displayed at a larger angle of view in a multi-domain mode. Typically the first comb teeth 101b and the shielding sections 101c of the common electrodes 101 shall be bent at a specific angle at their centers, and correspondingly the plate pixel electrodes 102 shall also be modified in shape at the centers of the electrode sections 102b. The particular bending angle can be set as needed, and for example, the bending angle can be set between 160 degrees and 180 degrees, between 10 degrees and 20 degrees, etc. When the pixel electrodes 102 and the common electrodes 101 are arranged at the same layer, they can be formed in the structure as illustrated in FIG. 4; and when the pixel electrodes 102 and the common electrodes 101 are arranged at different layers, they can be formed in the structure as illustrated in FIG. 6.

It shall be noted that for the sake of an illustration, other structures than the arrangement pattern of the common electrodes 101 and the pixel electrodes 102 have not been illustrated in details in FIG. 3 and FIG. 6, but has been illustrated in FIG. 2.

In an optional implementation, in order to make a signal applied to the common electrodes 101 more uniform, a plurality of common electrodes 101 can be connected together, optionally in an array substrate with a larger size. Hereupon optionally in the array substrate above according to the embodiment of this disclosure, as illustrated in FIG. 2 to FIG. 6, the sub-common electrodes G in two adjacent common electrodes 101 can be electrically connected through a connection line, and for example, the shielding sections 101c of two facing sub-common electrodes G can be connected together. In order to simplify a fabrication process, the respective common electrodes 101 can be formed directly along with the connection line. Furthermore for the clarity of an illustration, the pixel electrodes 102 in FIG. 5 and FIG. 6 are illustrated transparently only for their clarity, but neither a real fabrication process nor this disclosure will be limited thereto.

Based upon the same inventive idea, some embodiments of this disclosure further provide a display device including the array substrate according to any one of the embodiments above of this disclosure. Reference can be made to the array substrate according to any one of the embodiments above of this disclosure for an implementation of the display device, so a repeated description thereof will be omitted here.

In summary, in the array substrate and the display device according to the embodiments of this disclosure, each common electrode includes a plurality of sub-common electrodes, and each sub-common electrode generally includes a body connection section with a larger width and a lower resistance, and first comb teeth with a smaller width and a higher resistance; and in the embodiments of this disclosure, the body connection sections of two adjacent sub-common electrodes in each common electrode are arranged in two opposite directions, and correspondingly adjacent body connection sections with a lower resistance in the respective common electrodes are arranged separately on two sides, thus improving the uniformity of the resistance of the common electrode so as to improve a display effect of the display device as a whole.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An array substrate, comprising:
    a plurality of sub-pixel elements arranged in an array, wherein:
    each row of sub-pixel elements comprises a common electrode;
    the common electrode comprises a plurality of sub-common electrodes, each of the sub-common electrodes corresponds to one of the sub-pixel elements;
    each sub-common electrode comprises a body connection section, a plurality of first comb teeth connected with the body connection section, and a shielding section connected with the body connection section, wherein the first comb teeth and the shielding section are located on a same side of the body connection section, and the shielding section is on an outermost side of the first comb teeth;
    two adjacent sub-common electrodes in each common electrode share the shielding section; and
    the body connection sections of two adjacent sub-common electrodes in the common electrode are respectively connected to two opposite sides in a length direction of the shielding section.

2. The array substrate according to claim 1, wherein each of the sub-pixel elements comprises a pixel electrode;
the pixel electrode comprises a protruding connection section and an electrode section; and
in each of the sub-pixel elements, the protruding connection section of the pixel electrode, and the body connection section of the sub-common electrode are on the two opposite sides.

3. The array substrate according to claim 2, further comprises data lines and gate lines;
the data lines extend in a same direction as the shielding sections of the common electrodes, and there are overlapping areas between orthographic projections of the data lines in a direction perpendicular to the array substrate, and orthographic projections of the shielding sections of the common electrodes in the direction perpendicular to the array substrate; and
the gate lines extend in a direction intersecting with the data lines.

4. The array substrate according to claim 3, wherein two adjacent sub-pixel elements connected with each gate line belong respectively to different rows.

5. The array substrate according to claim 4, wherein the gate lines are bent lines, and in sub-pixel elements connected with a same gate line, the protruding connection sections of pixel electrodes of the sub-pixel elements are arranged alternately in parallel.

6. The array substrate according to claim 3, wherein the pixel electrodes and the common electrodes are at a same layer, and orthographic projections of the pixel electrodes in a direction perpendicular to the array substrate do not overlap with the orthographic projections of the common electrodes in the direction perpendicular to the array substrate.

7. The array substrate according to claim 6, wherein the electrode sections of the pixel electrodes comprise a plurality of second comb teeth connected with the protruding connection sections; and
the second comb teeth and the first comb teeth are arranged alternately in parallel in a direction parallel to the extension direction of the gate lines.

8. The array substrate according to claim 2, wherein the pixel electrodes and the common electrodes are arranged at different layers, and the electrode sections of the pixel electrodes are plate shape.

9. The array substrate according to claim 2, wherein the electrode sections of the pixel electrodes are structures comprising straight edges, and the first comb teeth of the common electrodes are straight.

10. The array substrate according to claim 2, wherein the electrode sections of the pixel electrodes are structures comprising bent edges, and the first comb teeth of the common electrodes are bent lines; and a bending angle of the bent lines of the electrode sections is same as a bending angle of the bent lines of the first comb teeth.

11. A display device, comprising the array substrate according to claim 1.

12. The display device according to claim 11, wherein each of the sub-pixel elements comprises a pixel electrode;
the pixel electrode comprises a protruding connection section and an electrode section; and
in each of the sub-pixel elements, the protruding connection section of the pixel electrode, and the body connection section of the sub-common electrode are on the two opposite sides.

13. The display device according to claim 12, wherein the array substrate further comprises data lines and gate lines;
the data lines extend in a same direction as the shielding sections of the common electrodes, and there are overlapping areas between orthographic projections of the data lines in a direction perpendicular to the array substrate, and orthographic projections of the shielding sections of the common electrodes in the direction perpendicular to the array substrate; and
the gate lines extend in a direction intersecting with the data lines.

14. The display device according to claim 13, wherein two adjacent sub-pixel elements connected with each gate line belong respectively to different rows.

15. The display device according to claim 14, wherein the gate lines are bent lines, and in sub-pixel elements connected with a same gate line, the protruding connection sections of pixel electrodes of the sub-pixel elements are arranged alternately in parallel.

16. The display device according to claim 13, wherein the pixel electrodes and the common electrodes are at a same layer, and orthographic projections of the pixel electrodes in a direction perpendicular to the array substrate do not overlap with the orthographic projections of the common electrodes in the direction perpendicular to the array substrate.

17. The display device according to claim 16, wherein the electrode sections of the pixel electrodes comprise a plurality of second comb teeth connected with the protruding connection sections; and
the second comb teeth and the first comb teeth are arranged alternately in parallel in a direction parallel to the extension direction of the gate lines.

* * * * *